US006682992B2

(12) United States Patent
Geiss et al.

(10) Patent No.: US 6,682,992 B2
(45) Date of Patent: Jan. 27, 2004

(54) METHOD OF CONTROLLING GRAIN SIZE IN A POLYSILICON LAYER AND IN SEMICONDUCTOR DEVICES HAVING POLYSILICON STRUCTURES

(75) Inventors: Peter J. Geiss, Underhill, VT (US); Joseph R. Greco, South Burlington, VT (US); Richard S. Kontra, Williston, VT (US); Emily Lanning, Westminster, SC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/147,270

(22) Filed: May 15, 2002

(65) Prior Publication Data
US 2003/0216013 A1 Nov. 20, 2003

(51) Int. Cl.$^7$ .......................... H01L 21/20; H01L 21/425
(52) U.S. Cl. ........................ 438/488; 438/486; 438/532
(58) Field of Search .................... 438/486, 488, 438/523, 530, 532, 378

(56) References Cited

U.S. PATENT DOCUMENTS

| | | | |
|---|---|---|---|
| 4,467,519 A | | 8/1984 | Glang et al. |
| 4,755,476 A | | 7/1988 | Bohm et al. |
| 5,242,844 A | * | 9/1993 | Hayashi ...................... 438/151 |
| 5,254,484 A | * | 10/1993 | Hefner et al. ................ 438/515 |
| 5,317,432 A | * | 5/1994 | Ino ............................. 349/39 |
| 5,373,192 A | * | 12/1994 | Eguchi ........................ 257/774 |
| 5,385,863 A | | 1/1995 | Tatsumi et al. |
| 5,683,935 A | | 11/1997 | Miyamoto et al. |
| 5,744,824 A | * | 4/1998 | Kousai et al. ................. 257/74 |
| 5,893,747 A | * | 4/1999 | Yang ........................... 438/592 |
| 6,030,874 A | * | 2/2000 | Grider et al. ................. 438/301 |
| 6,114,722 A | * | 9/2000 | Jan et al. ..................... 257/315 |
| 6,294,442 B1 | | 9/2001 | Kamal |

FOREIGN PATENT DOCUMENTS

EP        0 521 644        1/1993

OTHER PUBLICATIONS

Carbone et al., "Correlation of Ellipsometric Volumne Fraction to Polysilicon Grain Size from Transmission Electron Microscopy", Sep. 1999, IEEE/SEMI Advanced Semiconductor Manufacturing Conf. and Workshop, pp. 359–367.*
Becker et al., Low Resistance Polycrystalline Silicon by Boron or Arsenic Implantation and Thermal Crystallization of Amorphously Deposited Films, J. Appl. Phys., vol. 56, No. 4, Aug. 15, 1984, pp. 1233–1236.

* cited by examiner

Primary Examiner—Matthew Smith
Assistant Examiner—Lex H. Malsawma
(74) Attorney, Agent, or Firm—Schmeiser, Olsen & Watts; William D. Sabo

(57) ABSTRACT

A method of modulating grain size in a polysilicon layer and devices fabricated with the method. The method comprises forming the layer of polysilicon on a substrate; and performing an ion implantation of a polysilicon grain size modulating species into the polysilicon layer such that an average resultant grain size of the implanted polysilicon layer after performing a pre-determined anneal is higher or lower than an average resultant grain size than would be obtained after performing the same pre-determined anneal on the polysilicon layer without a polysilicon grain size modulating species ion implant.

31 Claims, 17 Drawing Sheets

METHOD OF CONTROLLING GRAIN SIZE IN A POLYSILICON LAYER AND IN SEMICONDUCTOR DEVICES HAVING POLYSILICON STRUCTURES

FIELD OF THE INVENTION

The present invention relates to the field of semiconductor manufacturing; more specifically, it relates to semiconductor devices fabricated with controlled grain size polysilicon structures and a method of fabricating semiconductor devices having controlled grain size polysilicon structures.

BACKGROUND OF THE INVENTION

Polysilicon layers are frequently used in forming the emitter of semiconductor devices such as bipolar transistors, the gate electrode of field effect transistors (FETs) and the resistive element in thin film and damascened resistors.

In the case of bipolar transistors and particularly SiGe bipolar transistors having low emitter resistance, high germanium base concentration and narrow base width are highly desirable in high performance devices. However, these conditions can result in extremely high current gain (b). Conventionally, emitter resistance has been lowered and base current increased (resulting in lower b) by reducing the thickness of the emitter/base interface oxide. However, there is a limit to how thin the interface oxide can become and still effectively prevent epitaxial realignment.

In the case of FET and resistor devices, as polysilicon gate electrode (polysilicon lines for resistors) width and height are reduced, depletion of dopant in the gate electrode due to channeling during ion implantation as well as dopant diffusion effects with reductions in activation anneal times and temperatures, results in non-uniform doping of the polysilicon gate (or line).

A method other than reducing the thickness of the emitter/base interface oxide thickness to control emitter resistance and base current in bipolar transistors and to overcome depletion of dopant in the gate electrode in FETs and to improve control of thin film and damascened resistors is required if the trend to smaller feature size and improved device performance is to continue.

SUMMARY OF THE INVENTION

A first aspect of the present invention is a method of modulating grain size in a polysilicon layer comprising: forming the layer of polysilicon on a substrate; and performing an ion implantation of a polysilicon grain size modulating species into the polysilicon layer such that an average resultant grain size of the implanted polysilicon layer after performing a pre-determined anneal is higher or lower than an average resultant grain size than would be obtained after performing the same pre-determined anneal on the polysilicon layer without a polysilicon grain size modulating species ion implant.

A second aspect of the present invention is a method of fabricating a bipolar transistor having a collector, a base and a polysilicon emitter comprising; implanting a dopant species and a polysilicon grain size modulating species into the polysilicon emitter; and annealing the implanted polysilicon emitter.

A third aspect of the present invention is a method of modulating a dopant species concentration profile in a polysilicon layer of a device comprising; implanting a dopant species and a polysilicon grain size modulating species into the polysilicon layer; and annealing the implanted polysilicon layer.

A fourth aspect of the present invention is a bipolar transistor comprising; a collector; a base; and a polysilicon emitter containing a dopant species and a polysilicon grain size modulating species.

A fifth aspect of the present invention is a device comprising; a polysilicon layer forming at least a portion of a structure of the device; and the polysilicon layer containing a dopant species and a polysilicon grain size modulating species.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
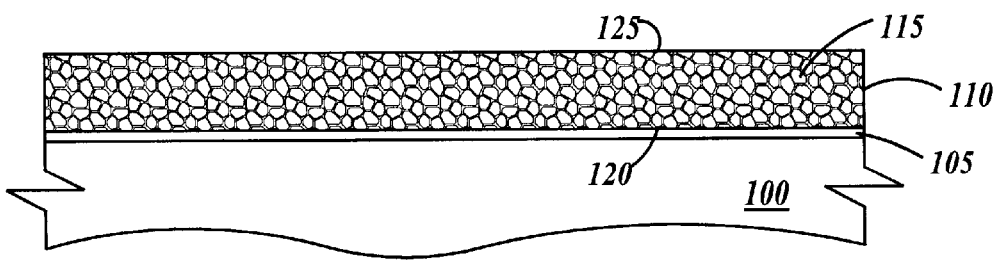
FIGS. 1 through 3B are partial cross-sectional views illustrating the method of controlling polysilicon grain size in a polysilicon layer according to the present invention.

FIGS. 1 through 3B are partial cross-sectional views illustrating the method of controlling polysilicon grain size in a polysilicon layer according to the present invention. In FIG. 1, formed on substrate 100 is a dielectric layer 105. Substrate 100 may be a silicon substrate. Formed on dielectric layer 105 is a polysilicon layer 110. Polysilicon layer 110 has a bottom surface 120 and a top surface 125. Polysilicon layer 110 may be formed, for example, by any number of well known means such as low-pressure chemical vapor deposition (LPCVD). Dielectric layer 105 may be a thermal or deposited oxide layer formed to prevent epitaxial silicon growth during the LPCVD process in the case of substrate 100 having a crystalline structure. Polysilicon layer 110 is formed of a multiplicity of polysilicon grains (also called micro crystals) 115 having an average as deposited grain size (or diameter) of $GS_1$. Should an anneal step (as described below) be performed immediately after deposition, polysilicon grains 115 would grow to an average post anneal grain size of $GS_2$.

Figure 2:
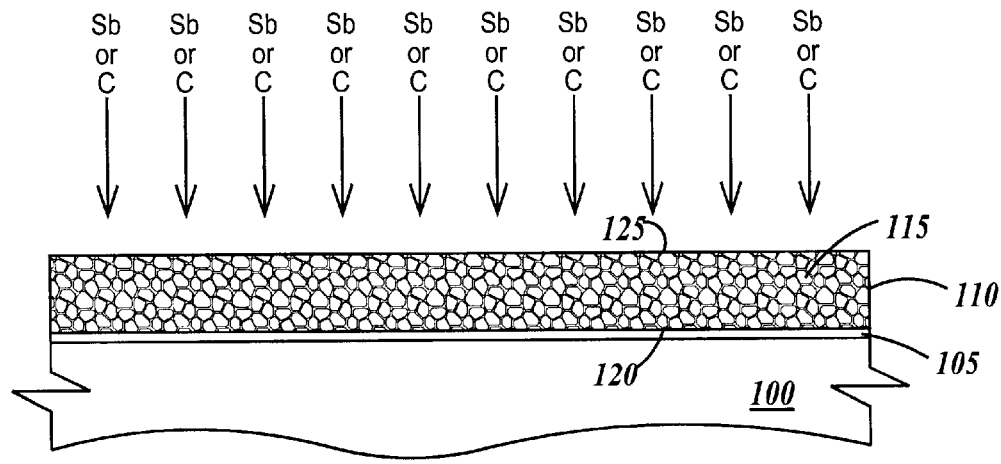
Figure 3A:
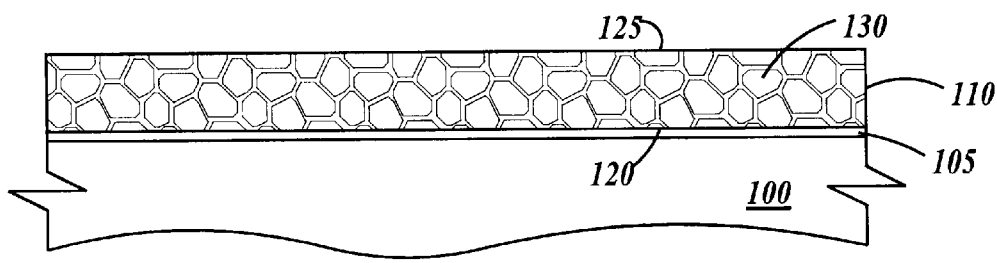
Figure 3B:
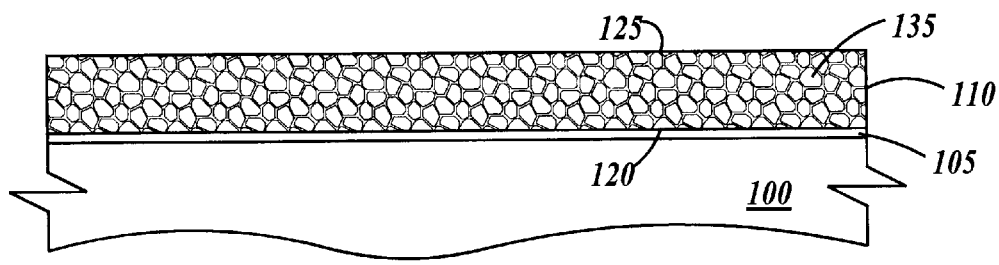

In FIG. 2, a grain size modulating ion implant of either antimony (Sb) or carbon (C) is performed. If an Sb ion implant is performed, then after an anneal step, polysilicon layer 110 will contain a multiplicity of polysilicon grains 130 having an average post anneal grain size of $GS_3$ where $GS_3$ is greater than $GS_2$ as illustrated in FIG. 3A. If a C ion implant is performed, then after an anneal step, polysilicon layer 110 will contain a multiplicity of polysilicon grains 135 having an average post anneal grain size of $GS_4$ where $GS_4$ is less than $GS_2$ as illustrated in FIG. 3B. Should a doped polysilicon layer be desired, a dopant species such as arsenic (As) may be implanted before or after the Sb or C ion implant.

In a first example, polysilicon layer 110 is about 1000 to 2200 Å thick and average as deposited grain size $GS_1$ varies from about 100 to 500 Å, increasing in size from about 100 Å near bottom surface 120 to about 300 to 500 Å near top surface 125. After an Sb ion implant of about 1E15 to 1.5E16 atm/cm$^2$ and at an energy of about 30 to 70 Kev followed by about a 900 to 1000° C. for about 5 to 20 second RTA, the average post anneal grain size $GS_3$ is about 1370 Å. (If, with no Sb ion implant, a 900 to 1000° C. for about 5 to 20 second rapid thermal anneal (RTA) were performed, the average post anneal grain size $GS_2$ would be about 770 Å). Should a doped polysilicon layer be desired, a dopant species may be implanted before or after the Sb ion implant.

In a second example, polysilicon layer 110 is about 1000 to 2200 Å thick and the average as deposited grain size $GS_1$ from about 100 Å near bottom surface 120 to about 300 to 500 Å near top surface 125. After a C ion implant of about a 1E14 to 1E16 atm/cm$^2$ and at an energy of about 15 to 35 Kev followed by about a 900 to 1000° C. for about 5 to 20 second RTA, the average post anneal grain size $GS_4$ is about 600 Å. (If, with no C ion implant, a 900 to 1000° C. for about 5 to 20 second RTA were performed, the average grain size $GS_2$ would be about 770 Å). Should a doped polysilicon layer be desired, a dopant species may be implanted before or after the C ion implant.

Figure 4:
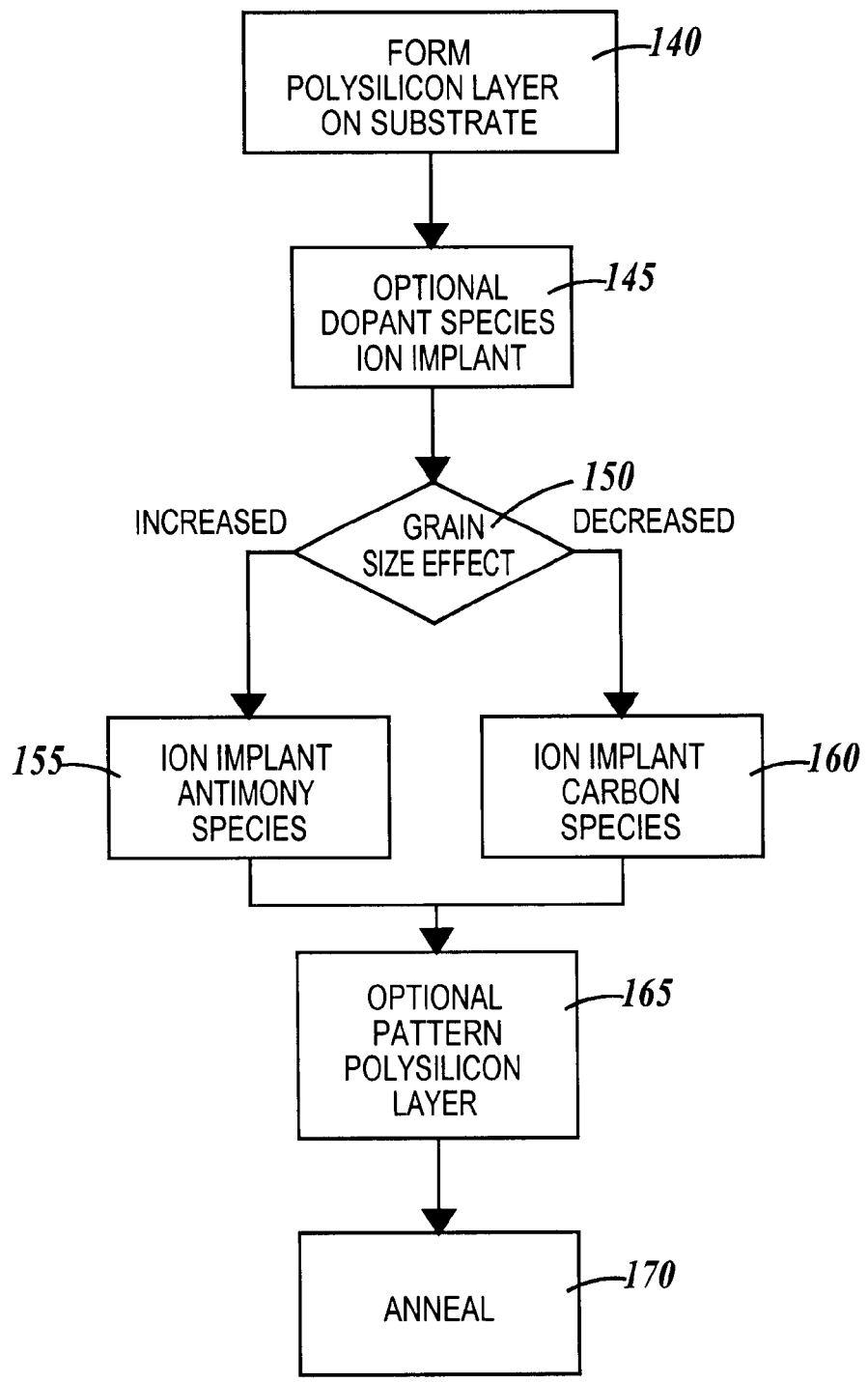
FIG. 4 is a flowchart of the method steps for controlling polysilicon grain size in a polysilicon layer according to the present invention.

FIG. 4 is a flowchart of the method steps for controlling polysilicon grain size in a polysilicon layer according to the present invention. In step 140, a polysilicon layer is formed on a substrate. In step 145, an optional dopant ion species (for example As) is implanted. In step 150, a decision is made as to whether the polysilicon layer is to have a larger or smaller post anneal grain size than would be obtained if no grain size modulating ion implant were performed. If it is decided that a larger post anneal grain size is desired, then in step 155 an Sb ion implant is performed. If it is decided that a smaller post anneal grain size is desired, then in step 160 a C ion implant is performed. In step 165, the polysilicon layer may be patterned using any number of well known photolithographic and reactive ion etch processes. In step 170, an anneal step is performed which inhibits polysilicon grain:size growth in the case of the C ion implant, or enhances polysilicon grain size growth in the case of the Sb ion implant.

In a first example, the polysilicon layer is about 1000 to 2200 Å thick and the average as deposited grain size GS, varies from about 100 Å near the bottom to about 300 to 500 Å near the top surface of the polysilicon layer. After an Sb ion implant at about a 1E15 to 1.5E16 atm/cm$^2$ and an energy of about 30 to 70 Kev followed by a 900 to 1000° C. for about 5 to 20 second RTA, the average post modulated anneal grain size is about 1370 Å. (If, with no Sb ion implant, a 900 to 1000° C. for about 5 to 20 second RTA were performed, the average post un-modulated anneal grain size $GS_2$ would be about 770 Å).

In a second example, the polysilicon layer is about 1000 to 2200 Å thick and, the average as deposited grain size $GS_1$ varies from about 100 Å near the bottom to about 300 to 500 Å near the top surface of the polysilicon layer. After a C ion implant at about a 1E14 to 1E16 atm/cm$^2$ to and an energy of about 15 to 35 Kev followed by a 900 to 1000° C. for about 5 to 20 second RTA, the average post anneal modulated grain size is about 600 Å. (If, with no C ion implant, a 900 to 1000° C. for about 5 to 20 second RTA were performed, the average un-modulated grain size would be about 770 Å).

Figure 5:
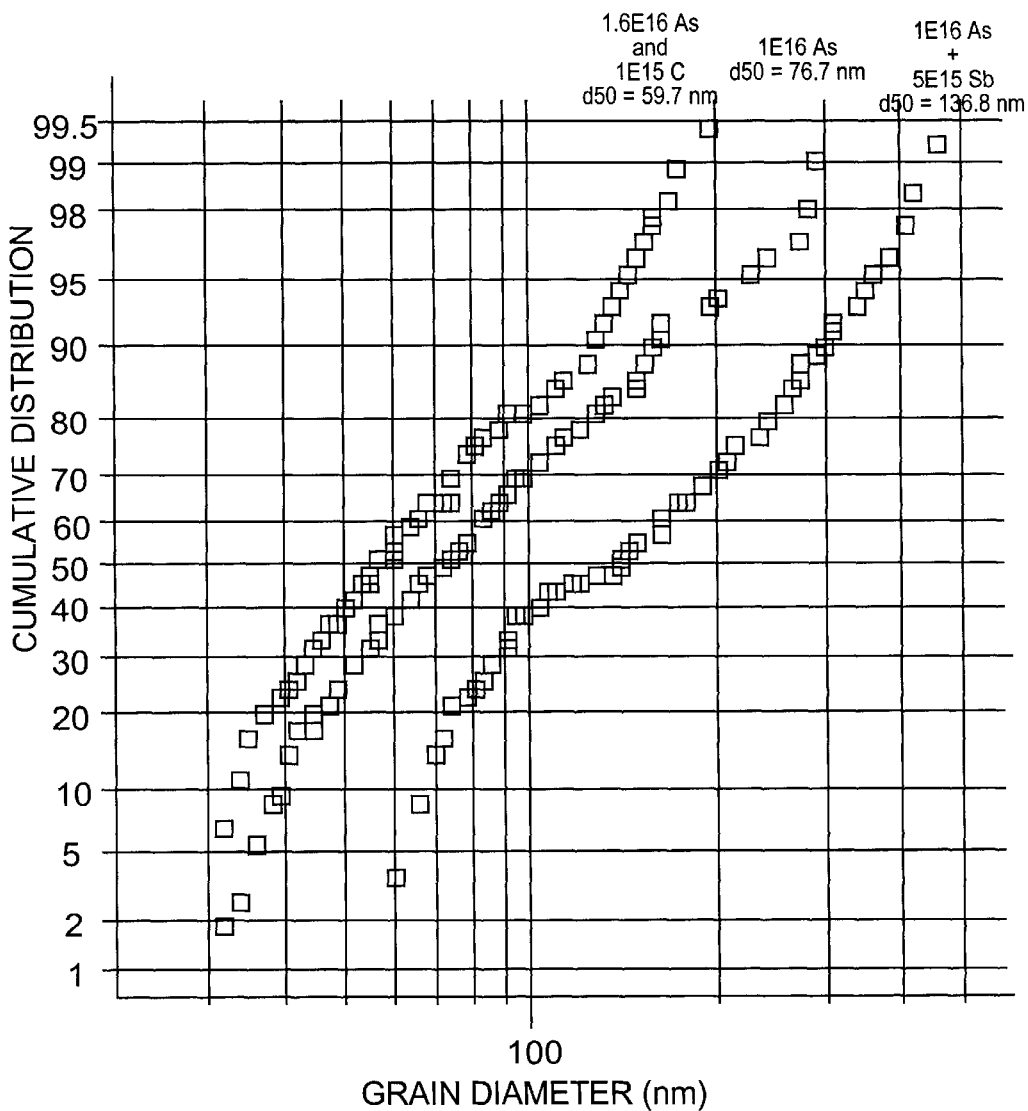
FIG. 5 is a cumulative distribution plot of polysilicon grain diameter in polysilicon layers fabricated according to the present invention.

FIG. 5 is a cumulative distribution plot of polysilicon grain diameter in polysilicon layers fabricated according to the present invention. Three curves are plotted in FIG. 5. The uppermost curve plots the cumulative distribution of post anneal polysilicon grain size for a 1600 Å thick polysilicon layer implanted with As at a dose of 1.6E16 atm/cm$^2$ and with C at a dose of 1E15 followed by a 5 second 900° C. RTA. The 50% point of the cumulative distribution corresponds to a polysilicon grain size of 59.7 nm. The middle curve plots the cumulative distribution of post anneal polysilicon grain size for a 1600 Å thick polysilicon layer implanted with As at a dose of 1.6E16 atm/cm$^2$ followed by a 5 second 900° C. RTA. The 50% point of the cumulative distribution corresponds to a polysilicon grain size of 76.7 nm. The lowermost curve plots the cumulative distribution of post anneal polysilicon grain size for a 1600 Å thick polysilicon layer implanted with As at a dose of 1.6E16 atm/cm$^2$ and with Sb at a dose of 5E15 atm/cm$^2$ followed by a 5 second 900° C. RTA. The 50% point of the cumulative distribution corresponds to a polysilicon grain size of 136.8 nm.

From FIG. 5 it is clear that addition of carbon inhibits polysilicon grain size growth while the addition of antimony enhances polysilicon grain size growth during post ion implant anneals. Sb and C ion implants are defined as polysilicon grain size modulation ion implants and Sb and C are defined as polysilicon grain size modulating species.

Figure 6:
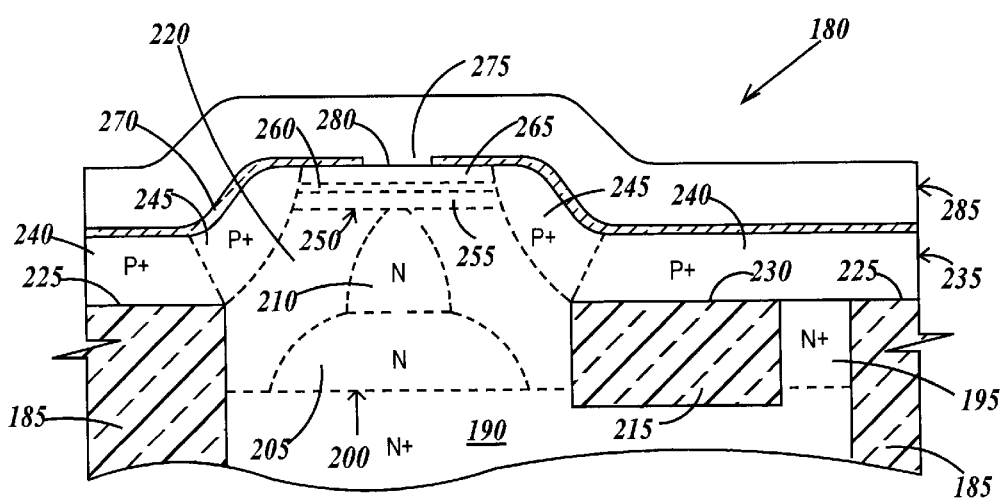
FIGS. 6 through 11 are partial cross-sectional views illustrating fabrication of a bipolar transistor according to the present invention.

FIGS. 6 through 11 are partial cross-sectional views illustrating fabrication of a bipolar transistor according to the present invention. In FIG. 6, partially formed bipolar transistor 180 includes deep trench isolation 185 surrounding an N+ subcollector 190. An N+ subcollector reach-through 195 contacts subcollector 190. A collector region 200 includes an N+ deep collector 205 on top of subcollector 190 and an N+ pedestal collector 210 on top of deep collector 205. Shallow trench isolation 215 separates collector region 200 from collector reach-through 195. An upper portion 220 of collector region 200 extends above a top surface 225 of deep trench isolation 185 and a top surface 230 of shallow trench isolation 215. Pedestal collector 210 extends into upper portion 220 of collector region 200.

A base layer 235 overlays and contacts deep trench isolation 185, upper portion 220 of collection region 200, shallow trench isolation 215 and collector reach through 195. Base layer 235 includes P+ polysilicon extrinsic base portions 240 contacting deep and shallow trench isolations 185 and 215 and N+ subcollector reach-through 195. Base layer 235 also includes P+ single-crystal extrinsic base portions 245 contacting upper portion 220 of collector region 200. Base layer 235 further includes a single-crystal intrinsic base portion 250, contacting pedestal collector 210 between single P+ single-crystal extrinsic base portions 245.

Intrinsic base portion 250 of base layer 235 includes a SiGe layer 255 contacting pedestal collector 210, a boron doped SiGe layer 260 on top of SiGe layer 255 and a silicon layer 265 on top of boron doped SiGe layer 260.

A first dielectric layer 270 extends on top of base layer 235. An emitter opening 275 is formed in dielectric layer 270 over intrinsic base portion 250 of base layer 235. An ultra-thin oxide layer of about 1 to 2 Å is formed on a top surface 280 of silicon layer 265, where the silicon layer is exposed in emitter opening 275. A polysilicon emitter layer 285 is formed on top of first dielectric layer 270 and top surface 280 of silicon layer 265. In one example, polysilicon emitter layer 285 is 1000 to 2200 Å thick having an as deposited gradient of polysilicon grain size from about 100 Å near first dielectric layer 270 to about 300 to 500 Å at the top of the emitter layer.

Figure 7:
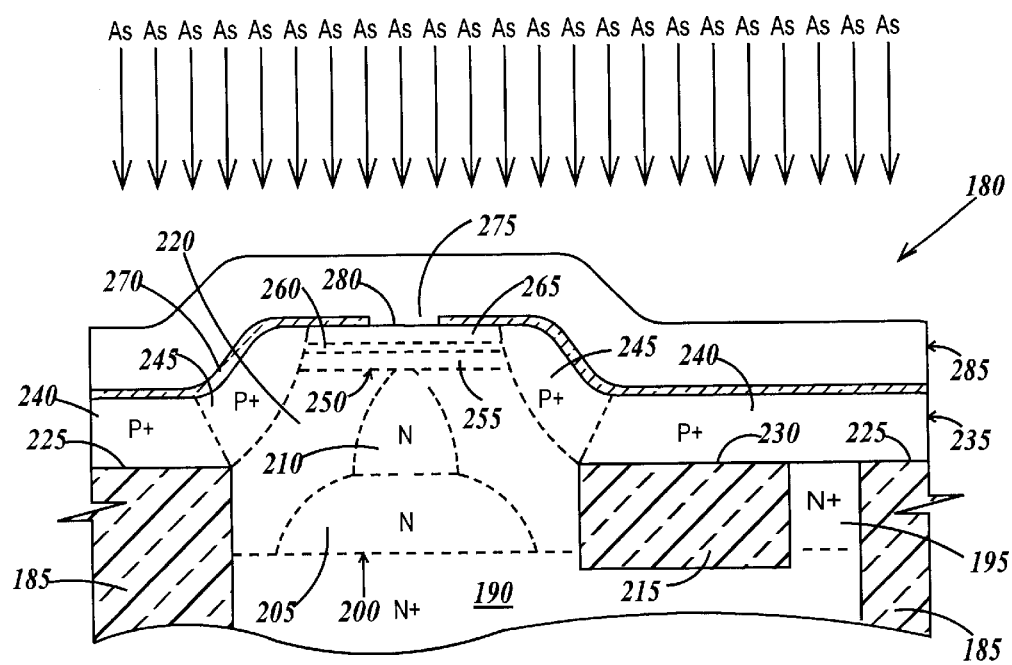

In FIG. 7, an arsenic ion implantation into polysilicon emitter layer 285 is performed. In one example, the arsenic ion implantation is performed at a dose of about 1E15 to 2.3E16 atm/cm$^2$ of As+ and at an energy of about 40 to 70 Kev.

Figure 8:
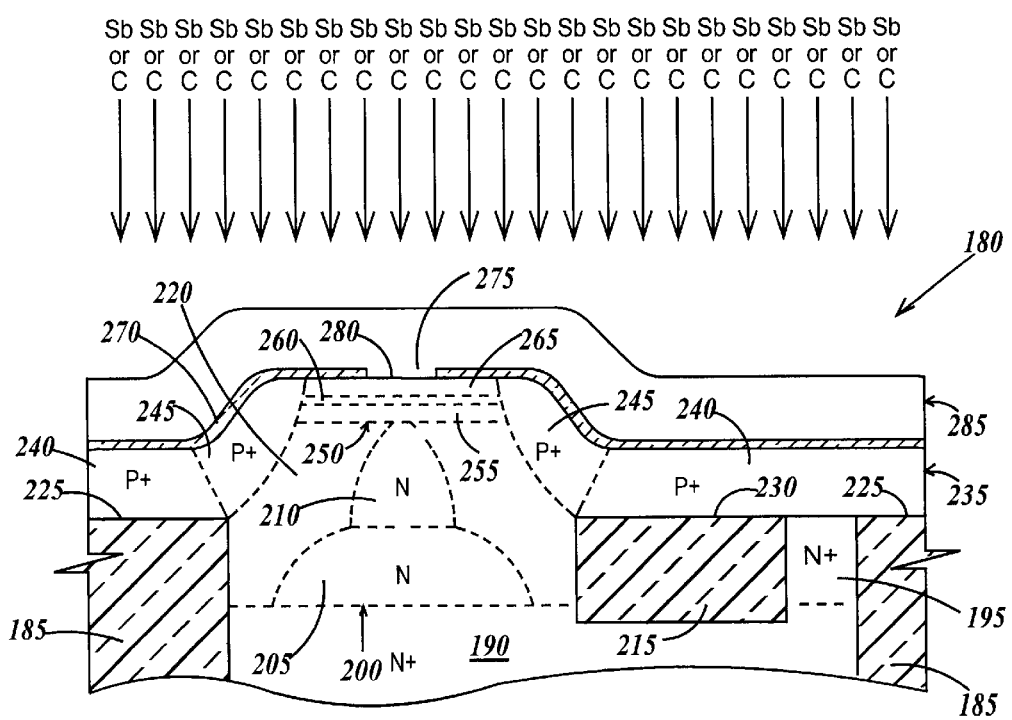

In FIG. 8, either an antimony or a carbon ion implantation into polysilicon emitter layer 285 is performed. In a first example, an antimony ion implantation is performed at a dose of about 1E15 to 2.3E16 atm/cm$^2$ and at an energy of about 30 to 70 Kev. In a second example, a carbon ion implantation is performed at a dose of about 1.2E14 to 2E16 atm/cm$^2$ of C and at an energy of about 15 to 35 Kev.

Figure 9:
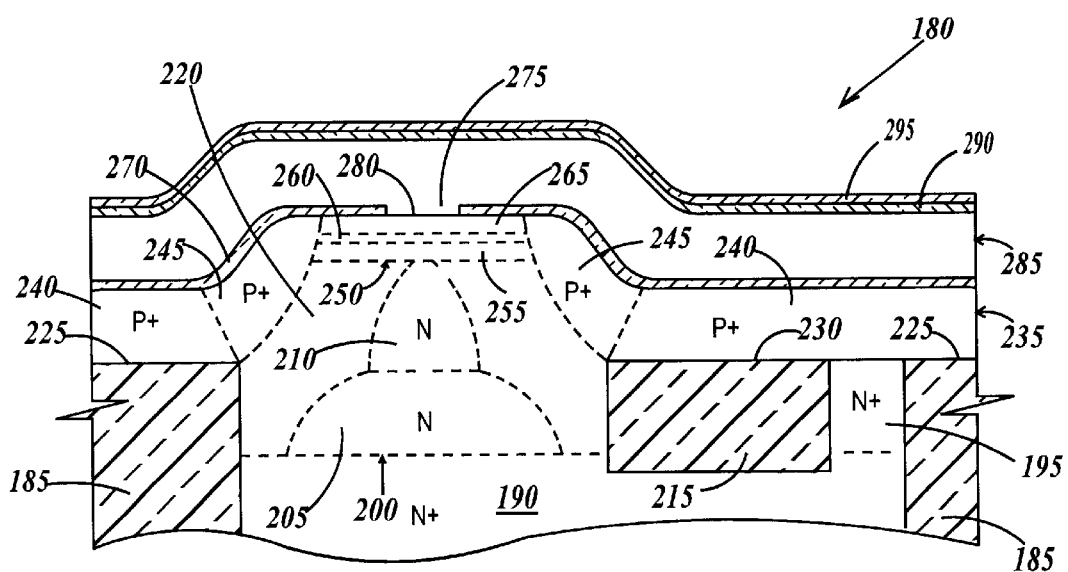

In FIG. 9, a second dielectric layer 290 is formed on polysilicon emitter layer 285, a first anneal performed, and a third dielectric layer 295 formed on top of the second dielectric layer. In one example, first dielectric layer 290 is 100 to 140 Å of plasma enhanced chemical vapor deposition (PECVD) silicon nitride, the first anneal is an RTA for 5 seconds at 800 to 1000° C. and second dielectric layer 295 is 1500 to 1900 Å of PECVD silicon nitride.

Figure 10:
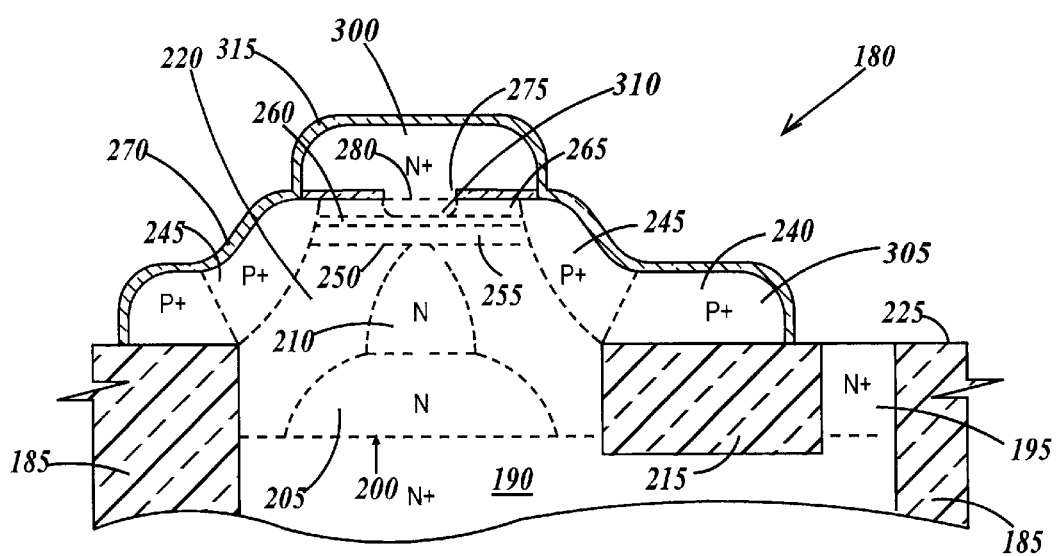

In FIG. 10, polysilicon emitter layer 285 (see FIG. 9) is patterned to form polysilicon emitter 300, and base layer 235 (see FIG. 9) is patterned to form base 305. A fourth dielectric layer 315 is formed on polysilicon emitter 300. A second anneal is performed to form single-crystal emitter 310 in silicon layer 265. In one example, the anneal is an RTA for 5 seconds at 800 to 1000° C. and fourth dielectric layer is about 100 Å of PECVD silicon nitride.

Figure 11:
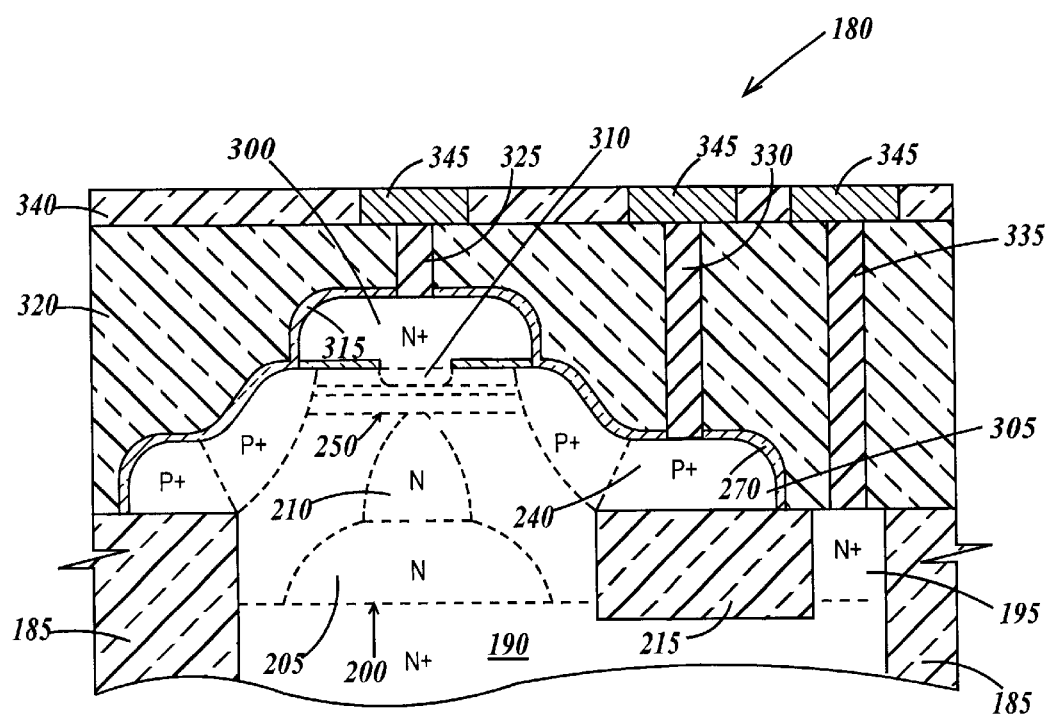

In FIG. 11, an fifth dielectric layer 320 is formed over entire device 180 (see FIG. 10). An emitter contact 325 is formed in fifth dielectric layer 320 through fourth dielectric layer 315 to contact polysilicon emitter 300. A base contact 330 is formed in fifth dielectric layer 320 through first dielectric layer 270 to contact extrinsic base portion 240 of base 305. A collector contact 335 is formed in fifth dielectric layer 320 through to contact emitter reach through 195. An interlevel dielectric layer 340 is formed over fifth dielectric layer 320 and first metal conductors 345 are formed in the interlevel dielectric layer contacting emitter contact 325, base contact 330 and collector contact 335.

In one example fifth dielectric layer 320 is borophosphorus-silicon glass; (BPSG) formed by PECVD, interlevel dielectric layer 340 is tetraethoxysilane (TEOS) oxide formed by PECVD, contacts 325, 330 and 335 are formed from tungsten by well known damascene processes and first metal conductors 345 are formed from aluminum, titanium or copper by well known damascene processes. Metal silicide may be formed at the contact silicon interfaces. Fabrication of bipolar transistor 180 is essentially complete.

Figure 12:
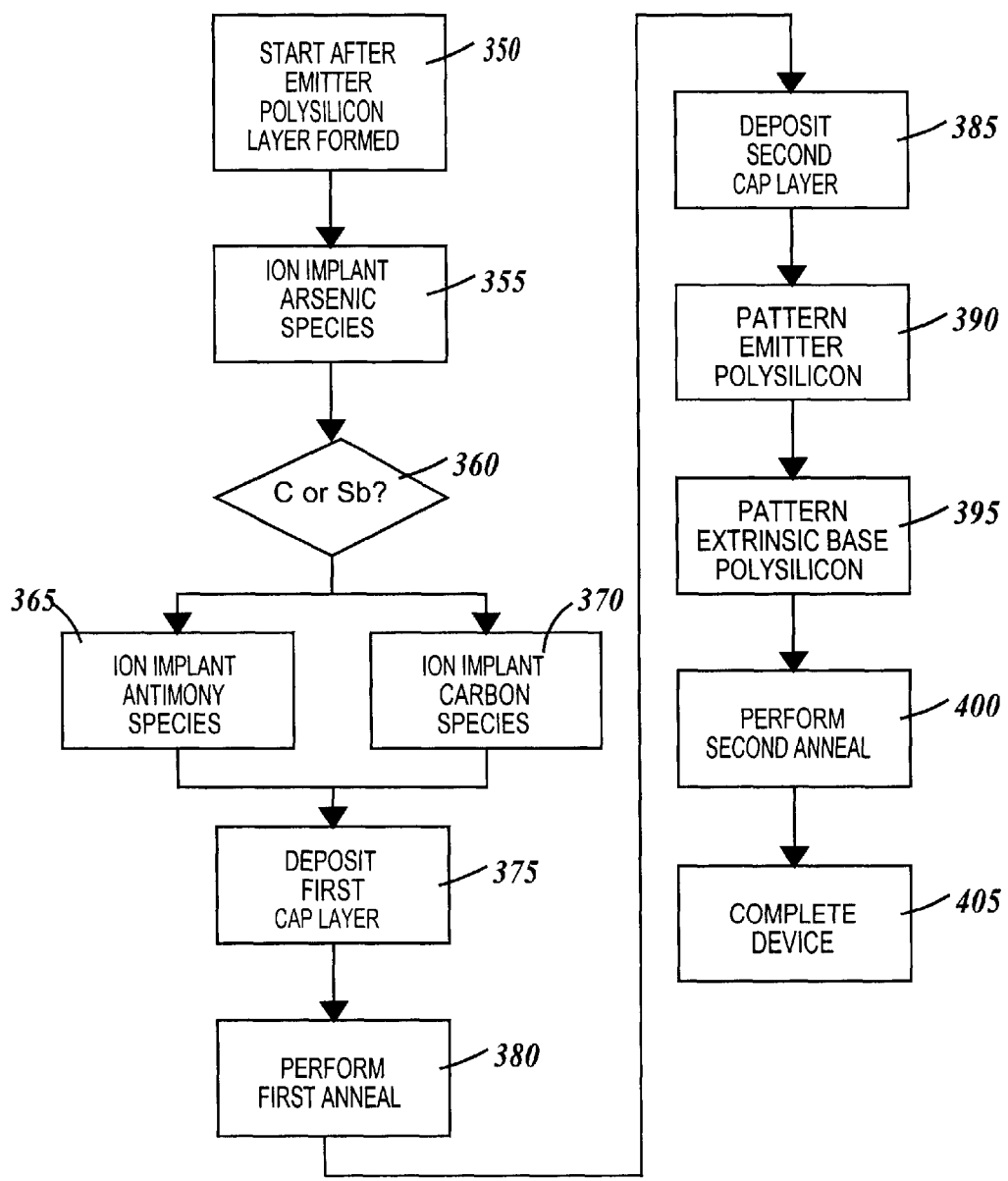
FIG. 12 is a flowchart of the method steps for fabricating a bipolar transistor according to the present invention.

FIG. 12 is a flowchart of the method steps for fabricating a bipolar transistor according to the present invention. In step 350, normal processing is performed in the fabrication of a bipolar transistor up to and including formation of the polysilicon emitter layer as illustrated in FIG. 6 and described above. Note neither the polysilicon emitter layer or the base; layer has been patterned and are blanket layers at this point in the fabrication process. Also, the base layer has a polysilicon portion and a single-crystal portion. In one example, the emitter layer is 1000 to 2200 Å thick having an as deposited gradient of polysilicon grain size from about 100 Å from the bottom to about 300 to 500 Å at the top of the polysilicon emitter layer.

In step 355, an arsenic ion implantation of the polysilicon emitter layer is performed. In one example, the arsenic ion implantation is performed at a dose of about 1E15 to 2.3E16 atm/cm$^2$ of As and at an energy of about 40 to 70 Kev.

In step 360, a decision is made as to whether the polysilicon emitter layer is to have a larger or smaller post anneal grain size than would be obtained if no grain size modulating ion implant were performed. If it is decided that a larger post anneal grain size is desired, then in step 365 an Sb ion implant is performed. In one example, the Sb ion implantation is performed at a dose of about 1E15 to 2.3E16 atm/cm$^2$ and at an energy of about 30 to 70 Kev. If it is decided that a smaller post anneal grain size is desired, then in step 370 a C ion implant is performed. In one example, the carbon ion implantation is performed at a dose of about 1.2E14 to 2E16 atm/cm$^2$ of C and at an energy of about 15 to 35 Kev.

In step 375 a first a cap layer is formed over the polysilicon emitter layer. In one example, the first cap layer is 100 to 140 Å of plasma enhanced chemical vapor deposition (PECVD) silicon nitride. In step 380, a first anneal performed. The purpose of the first anneal is to distribute the As throughout the polysilicon emitter layer. In one example the first, anneal is an RTA for 5 seconds at 800 to 1000° C. anneal. In step 385, a second cap layer is formed over the first cap layer. In one example, second cap layer is 1500 to 1900 Å of PECVD silicon nitride.

In step 390, the polysilicon emitter layer is patterned to form the polysilicon portion of the emitter of the bipolar transistor by any one of well known photolithographic and RIE techniques. In step 395, the base layer is patterned to form the base of the bipolar transistor by any one of well known photolithographic and RIE techniques. In step 400, a second anneal is performed to drive the As into the single-crystal portion of the base to form the single-crystal emitter of the bipolar transistor. In one example, the second anneal is an RTA for 5 seconds at 800 to 1000° C.

In step 405, the bipolar transistor is completed as illustrated in FIG. 11 and described above.

Figure 13:
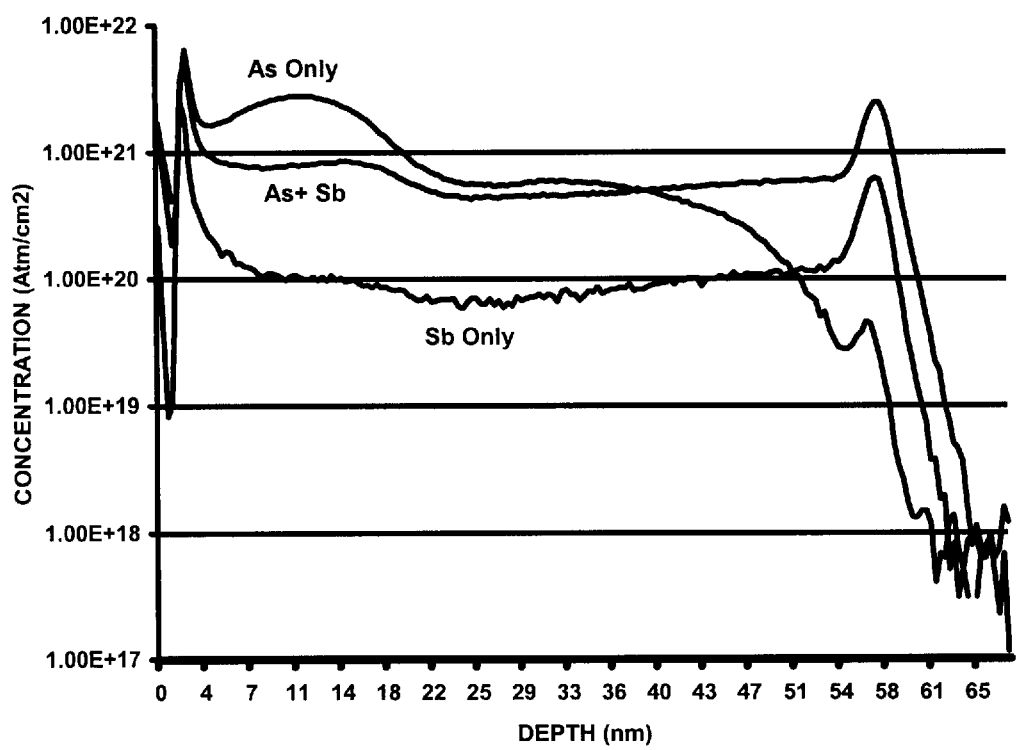
FIG. 13 is a plot of implanted species versus depth for the polysilicon emitter of a bipolar transistor fabricated according to the present invention.

FIG. 13 is a plot of implanted species versus depth for the polysilicon emitter of a bipolar transistor fabricated according to the present invention. In FIG. 13, the topmost curve (As Only) is for an As only implant of 1.7E16 atm/cm$^2$, the middle curve (As+Sb), which shows the As profile, is for a As implant of 1.2E16 atm/cm$^2$ followed by an Sb ion implant of 5E15 atm/cm$^2$ and the bottom curve (Sb Only) is for an Sb only implant of 5E15 atm/cm$^2$. A 5 second 900° C. RTA was performed after ion implantation. The measurement technique was secondary ion mass spectroscopy (SIMS). Examination of the As Only curve indicates that the As concentration declines steadily from about 13 nm to about 60. Examination of the Sb Only curve indicates that the Sb concentration remains relatively level at near 1E20 atm/cm$^3$ from about 10 to 55 nm with a jump to about 9E20 atm/cm$^3$ at about 58 nm. Examination of the As+Sb curve indicates the As concentration remains relatively constant near about 9E20 atm/cm$^3$ from between about 10 to 55 nm with a jump to about 4E21 atm/cm$^3$ at about 58 nm. The As+Sb curve pretty much mirrors the Sb Only curve, indicating the As is "following" the Sb during the anneal. Leveling and increasing the dopant concentration deeper into the emitter are desirable in advanced bipolar transistors (as well as advanced FET transistors and resistors fabricated with polysilicon).

Since implanting polysilicon grain size modulating species also modulates the dopant concentration profile of any dopant present in the polysilicon layer, the terms polysilicon grain size modulating ion implant or species and dopant concentration profile modulating ion implant or species are defined as equivalent terms for the purposes of the present invention and Sb and C are examples of such species.

Figure 14:
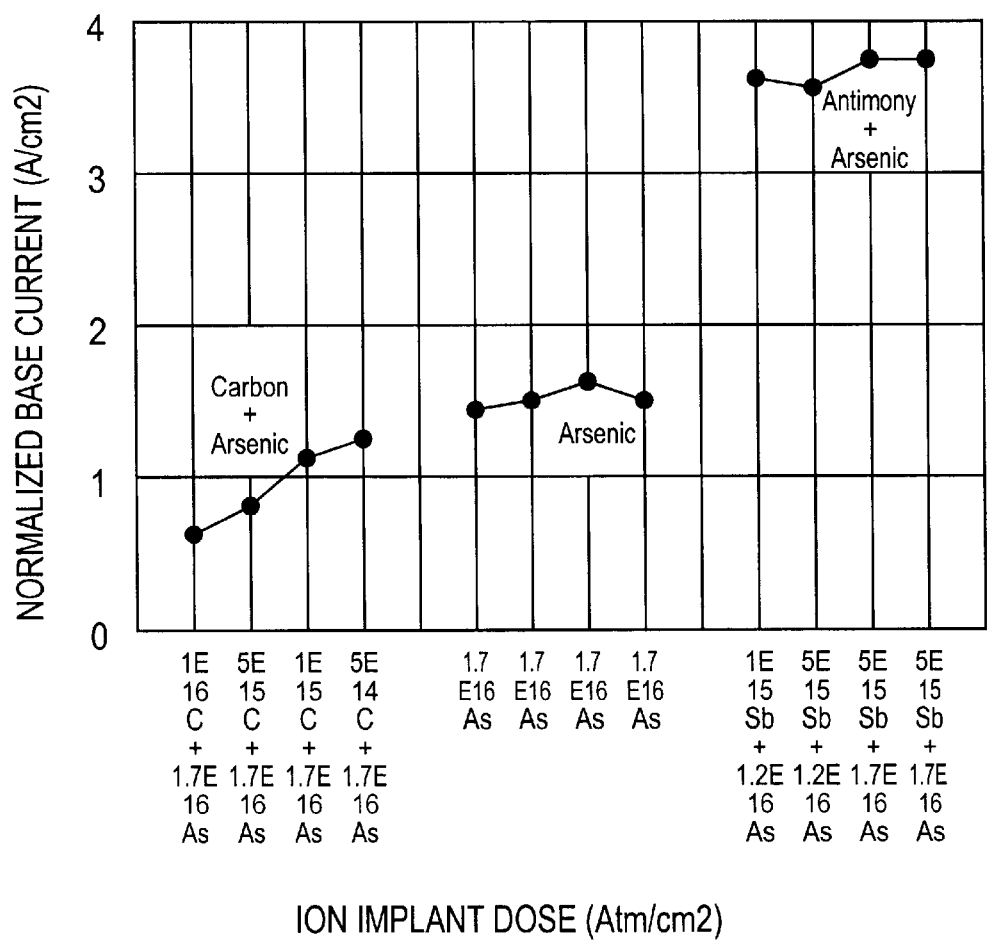
FIG. 14 is a plot of normalized base current versus selected combinations of implanted species and dose for a bipolar transistor fabricated according to the present invention.

FIG. 14 is a plot of normalized base current versus selected combinations of implanted species and dose for a bipolar transistor fabricated according to the present invention. The measurements where made on a bipolar transistor fabricated as illustrated in FIGS. 6 through 12 and described above. Measurements were made on four bipolar transistors having an As implant of 1.7E16 atm/cm$^2$ followed by C ion implants of 1E15, 5E16, 1E15 and 5E14 atm/cm$^2$ respectively, on four bipolar transistors having only As implants of 1.2E16 atm/cm$^2$, on two bipolar transistors having an As implant of 1.2E16 atm/cm$^2$ followed by Sb ion implants of 1E15 and 5E16 atm/cm$^2$ respectively and on two bipolar transistors having an As implant of 1.7E16 atm/cm$^2$ followed by Sb ion implants of 5E15 atm/cm$^2$.

FIG. 14 shows carbon decreases the base current and antimony substantially increases the base current. Increased base current is desirable in advanced bipolar transistors.

Since implanting polysilicon grain size modulating species also modulates the base current of the bipolar transistor, the terms polysilicon grain size modulating ion implant or species and base current modulating ion implant or species are defined as equivalent terms for the purposes of the present invention and Sb and C are examples of such species.

Figure 15:
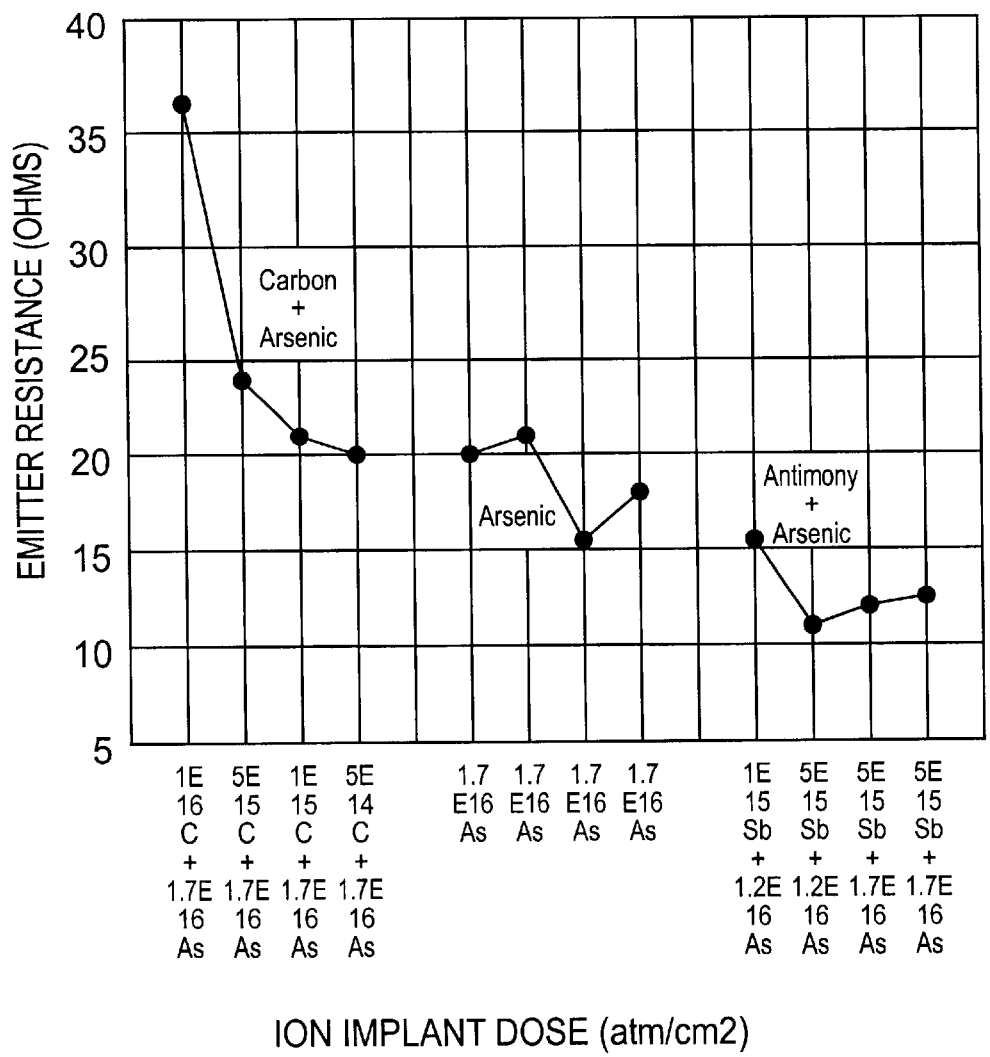
FIG. 15 is a plot of emitter resistance versus selected combinations of implanted species and dose for a bipolar transistor of fabricated according to the present invention.

FIG. 15 is a plot of emitter resistance versus selected combinations of implanted species and dose for a bipolar transistor of fabricated according to the present invention. The emitter resistance measurements where made on a bipolar transistor fabricated as illustrated in FIGS. 6 through 12 and described above. Measurements were made on four bipolar transistors having an As implant of 1.7E16 atm/cm$^2$ followed by C ion implants of 1E15, 5E16, 1E15 and 5E14 atm/cm$^2$ respectively, on four bipolar transistors having only As implants of 1.7E16 atm/cm$^2$, on two bipolar transistors having an As implant of 1.7E16 atm/cm$^2$ followed by Sb ion implants of 1E15 and 5E15 atm/cm$^2$ respectively and on two bipolar transistors having an As implant of 1.7E16 atm/cm$^2$ followed by Sb ion implants of 5E15 atm/cm$^2$.

FIG. 15 shows carbon increases the emitter resistance and as the carbon dose is increased the emitter resistance increases and antimony substantially decreases the emitter resistance. Decreased emitter resistance is desirable in advanced bipolar transistors.

Since implanting polysilicon grain size modulating species also modulates the emitter resistance of the bipolar transistor, the terms polysilicon grain size modulating ion implant or species and emitter resistance modulating ion implant or species are defined as equivalent terms for the purposes of the present invention and Sb and C are examples of such species.

While not illustrated a C ion implant into the emitter increases the sheet resistance ($\Omega/\square$) of the emitter by about 50% while an Sb ion implant into the emitter decrease the sheet resistance of the emitter by about 50%. Decreased emitter sheet resistance is desirable in advanced bipolar transistors.

Since implanting polysilicon grain size modulating species also modulates the sheet resistance of the emitter of the bipolar transistor, the terms polysilicon grain size modulating ion implant or species and emitter sheet resistance modulating ion implant or species are defined as equivalent terms for the purposes of the present invention and Sb and C are examples of such species.

Therefore, it has been shown that C and Sb ion implants into bipolar transistors can modulate the concentration of the emitter dopant, the base current, the emitter resistance and the emitter sheet resistance and that an Sb ion implant will move these parameters in the direction most helpful in the design of advanced bipolar transistors.

Figure 16:
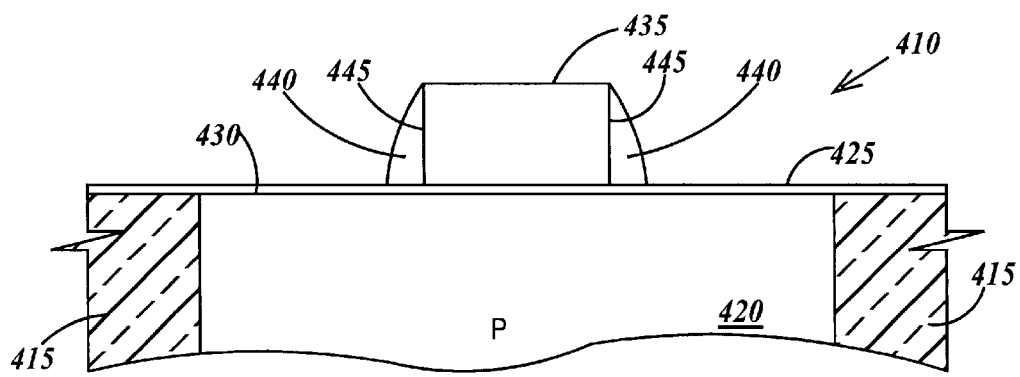
FIGS. 16 through 20 are partial cross-sectional views illustrating fabrication of a field effect transistor according to the present invention.

FIGS. 16 through 20 are partial cross-sectional views illustrating fabrication of a field effect transistor according to the present invention. In FIG. 16, a partially fabricated NFET 410 is illustrated. NFET 410 includes STI 415 formed in formed in a P well 420. A thin gate oxide layer 425 is formed on a top surface 430 of P well 420 and STI 415. A polysilicon gate 435 is formed on top of gate oxide layer 425 over P well 420 and first spacers 440 are formed on sidewalls 445 of the polysilicon gate.

Figure 17:
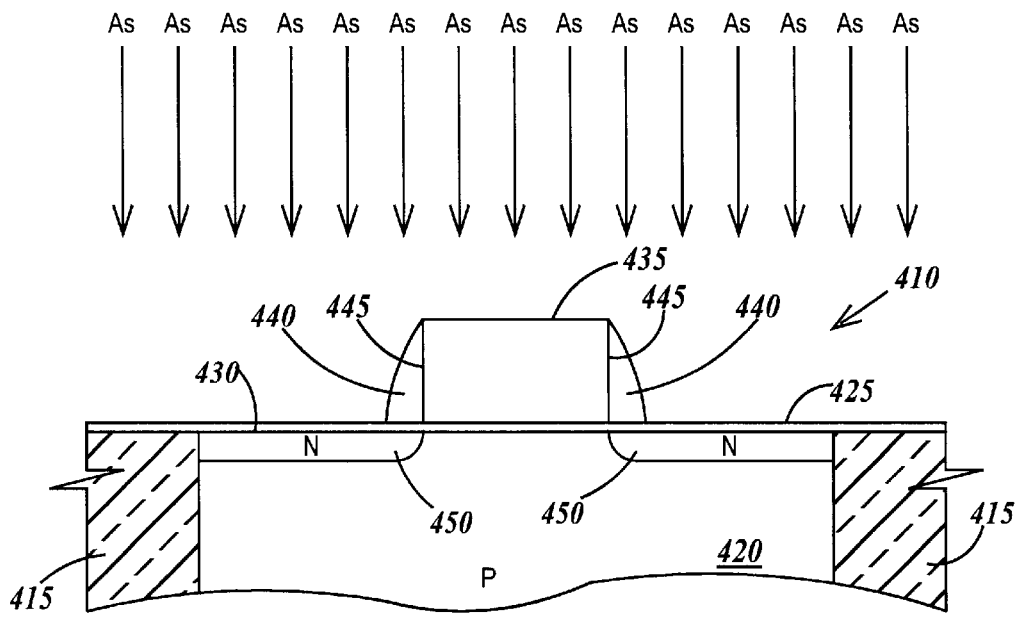

In FIG. 17, an halo ion implant is performed to form source/drain (S/D) extensions 450 in P well 420, near top surface 430. In one example the halo implant includes an As implantation at a dose of about 8E14 atm/cm$^2$ and an energy of about 15 Kev.

Figure 18:
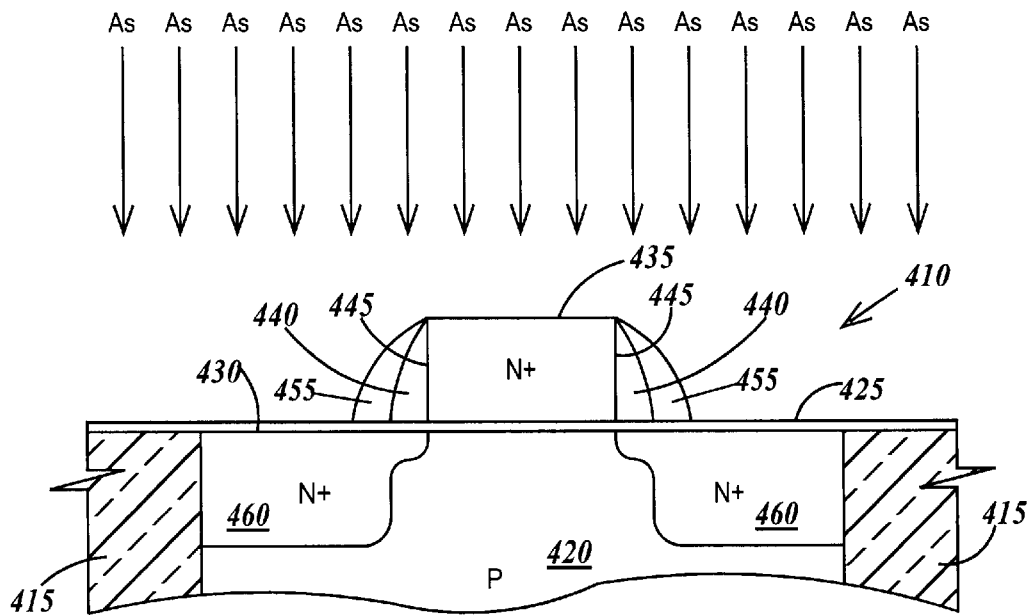

In FIG. 18, second spacers 455 are formed over first spacers 440 and an S/D ion implant is performed to form S/Ds 460. In one In one example the S/D implant includes a As implantation at a dose of about 5E15 atm/cm$^2$ and an energy of about 30 to 70 Kev.

Figure 19:
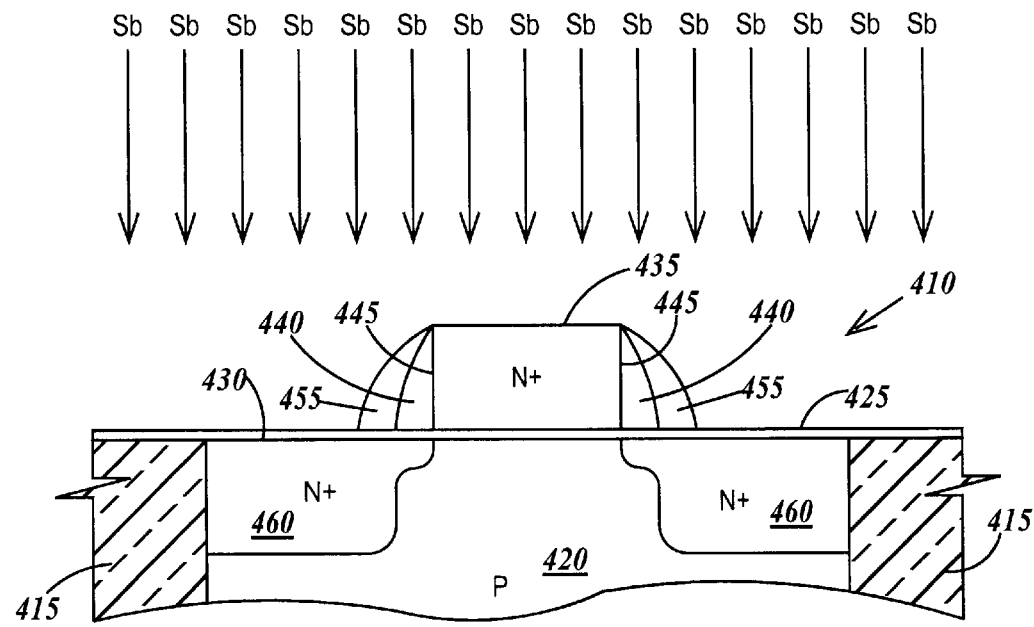

In FIG. 19, a polysilicon grain size profile modulation ion implant is performed. In one example the polysilicon grain size profile modulation ion implant is Sb implanted at a dose of about 1E15 to 1E16 atm/cm$^2$ and an energy of about 15 Kev. An optional masking step, covering S/Ds 460 but leaving polysilicon gate 435 exposed maybe performed to stop the modulating ion implant penetrating into S/Ds 460.

Figure 20:
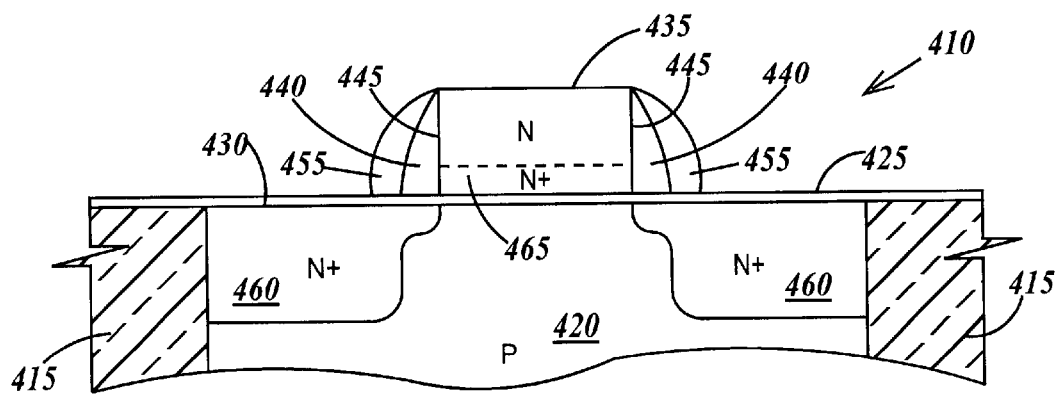

In FIG. 20, an anneal is performed to increase the concentration of As in a lower region 465 of polysilicon gate 435. In one example, the anneal is a 5 second 900° C. RTA. Because the antimony has enhanced the diffusion of arsenic in polysilicon gate 435, depletion of dopant in the gate electrode due to channeling during ion implantation as well as dopant diffusion effects are mitigated.

Figure 21:
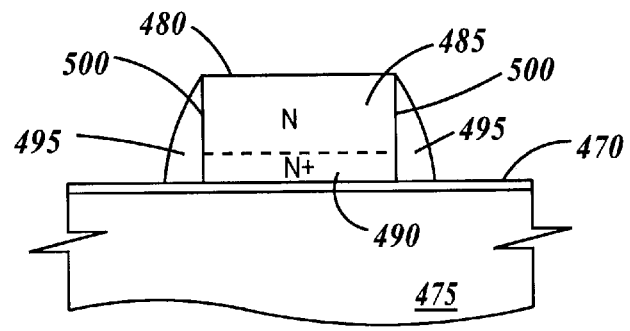
FIG. 21 is a partial cross-sectional view of a thin film resistor fabricated according to the present invention.

FIG. 21 is a partial cross-sectional view of a thin film resistor fabricated according to the present invention. Formed on top of an insulating layer 470 formed on a substrate 475 is a polysilicon thin film resistor 480, having a upper region 485 and a lower region 490. Upper region 485 contains Sb and As and lower region 490 contains Sb and an enhanced concentration of As. Optional spacers 495 are formed on sidewalls 500 of thin film resistor 480. Upper and lower regions 485 and 490 of thin film resistor 480 are formed by processes similar to those illustrated in FIGS. 18 through 20 for NFET 410 and such processes are further illustrated and described in FIG. 24.

Figure 22:
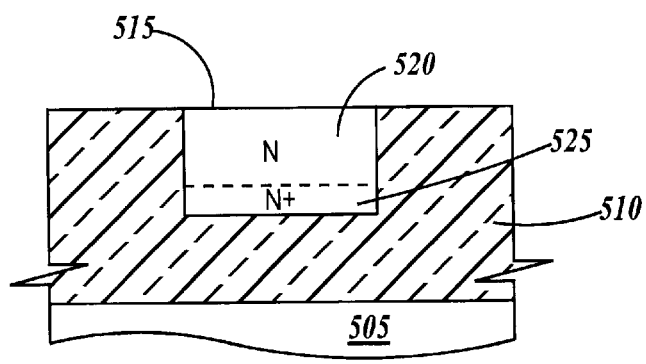
FIG. 22 is a partial cross-sectional view of a damascened thin film resistor fabricated according to the present invention.

FIG. 22 is a partial cross-sectional view of a damascened thin film resistor fabricated according to the present invention. Formed on a substrate 505 is an interlevel dielectric layer 510 or other dielectric layer. Formed in interlevel dielectric layer 510 is a damascened polysilicon resistor 515 having an upper region 520 and a lower region 525. Damascened polysilicon resistor 515 is formed by well known damascene techniques. Upper region 520 contains Sb and As and lower region 525 contains Sb and an enhanced concentration of As. Upper and lower regions 520 and 525 of damascened thin film resistor 515 are formed by processes similar to those illustrated in FIGS. 18 through 20 for NFET 410 and such processes are further illustrated and described in FIG. 25.

Figures 23, 24, 25:
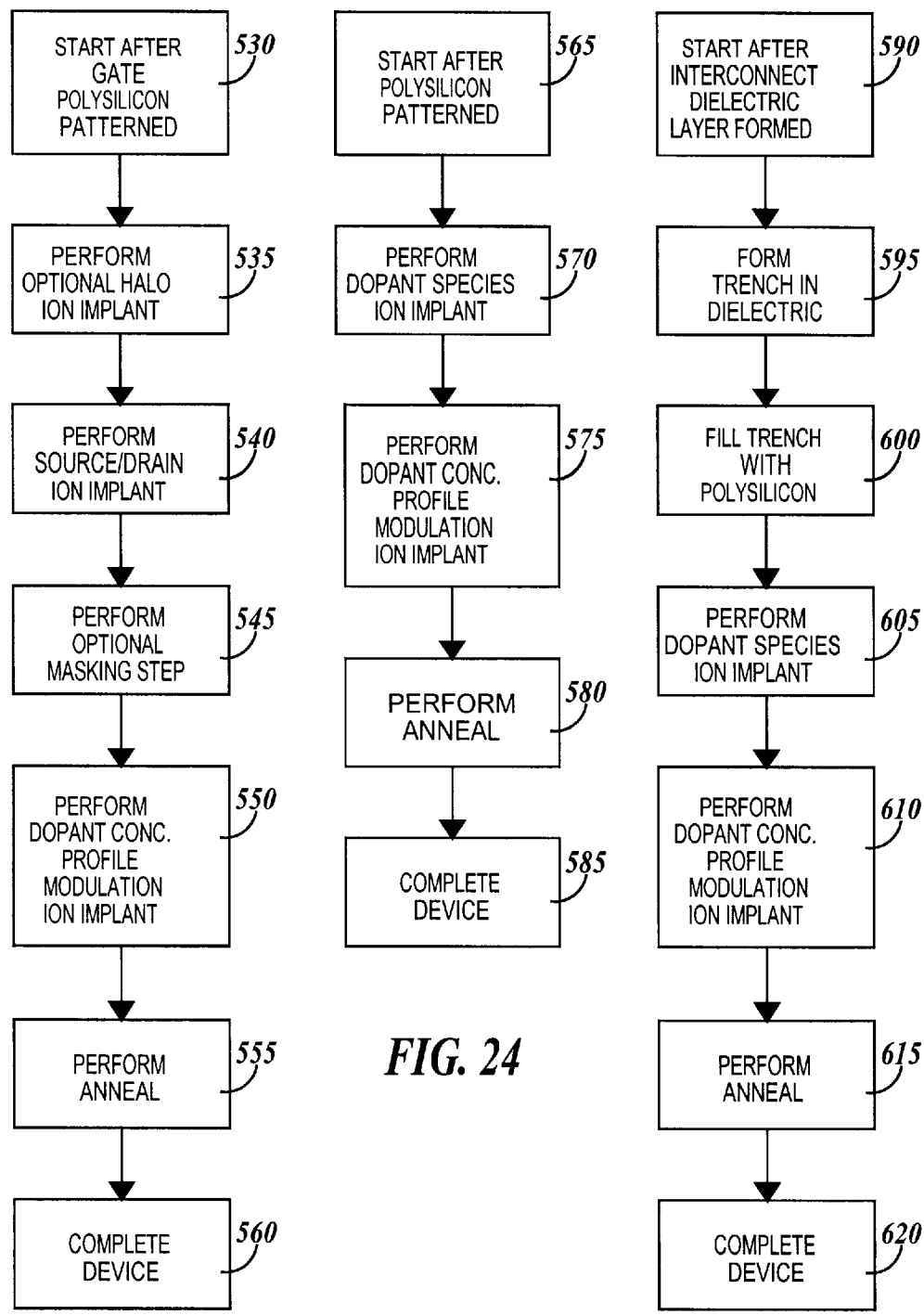
FIG. 23 is a flowchart of the method steps for fabricating a field effect transistor according to the present invention.
FIG. 24 is a flowchart of the method steps for fabricating a thin film resistor according to the present invention.
FIG. 25 is a flowchart of the method steps for fabricating a damascened thin film resistor according to the present invention.

FIG. 23 is a flowchart of the method steps for fabricating a field effect transistor according to the present invention. In step 530, normal processing is performed in the fabrication of an NFET transistor up to and including formation of the polysilicon gate as illustrated in FIG. 16 and described above. In one example, the emitter layer is 1000 to 2200 Å thick.

In step 535, a halo implantation of the P well on either side of the gate is performed. In one example, the halo implant implantation includes an As implantation at a dose of about 8E14 atm/cm$^2$ and an energy of about 15 Kev.

In step 540, a S/D implantation is performed. In one example, the S/D implant implantation includes an As implantation at a dose of about 1E15 to 1E16 atm/cm$^2$ at an energy of about 40 to 70 Kev.

In step 545, an optional masking step, covering the S/D regions of the NFET but leaving the polysilicon gate exposed may be performed to stop the polysilicon grain size modulation ion implant of step 550 from modulating the dopant concentration profile of the S/Ds.

In step 550, a polysilicon grain size modulation ion implant is performed. In one example, the polysilicon grain size modulation ion implant is an Sb ion implantation performed at a dose of about 1E15 to 1E16 atm/cm$^2$ and at an energy of about 30 to 70 Kev.

In step 555, an anneal is performed. The purpose of the anneal is to distribute the dopant species (for example As) and the Sb throughout: the polysilicon emitter layer and especially increase the dopant concentration near the polysilicon gate/gate oxide interface. In one example, the anneal is an RTA for 5 seconds at 800 to 1000° C. anneal.

In step 560, the NFET transistor is completed by forming contacts to the S/Ds and gate by processes well known in the art.

FIG. 24 is a flowchart of the method steps for fabricating a thin film resistor according to the present invention. In step 565, normal processing is performed in the fabrication of a thin film resistor up to and including formation of a polysilicon line. In one example, the polysilicon line is 1000 to 2200 Å thick.

In step 570, a dopant species is implanted. In one example, the dopant species is As implanted at a dose of about 1E15 to 1E16 atm/cm$^2$ at an energy of about 40 to 70 Kev.

In step 575, a polysilicon grain size modulation ion implant is performed. In one example, the polysilicon grain size modulation ion implant is an Sb ion implantation performed at a dose of about 1E15 to 1E16 atm/cm$^2$ and at an energy of about 30 to 70 Kev.

In step 580, an anneal is performed. The purpose of the anneal is to distribute the dopant species (for example As) and the Sb throughout the polysilicon line and especially more uniformly distribute the dopant than with otherwise occur without the dopant concentration profile modulation ion implant of step 575. In one example, the anneal is an RTA for 5 seconds at 800 to 1000° C. anneal.

In step 585, the thin film resistor is completed by forming contacts to the ends of the polysilicon line by processes well known in the art. The thin film resistor thus produced has improved resistance over conventional damascene resistors due to the improved dopant concentration profile caused by of the dopant concentration profile modulation ion implant.

FIG. 25 is a flowchart of the method steps for fabricating a damascened thin film resistor according to the present invention. In step 590, a substrate having a dielectric layer formed thereon is provided. In one example, the dielectric is an interlevel dielectric of TEOS oxide.

In step 595, a trench is formed in the dielectric layer by well known photolithographic and RIE techniques. In one example, the trench is 1000 to 2200 Å deep.

In step 600, the trench is filled with polysilicon by depositing polysilicon on the surface of the dielectric and in the trench and performing a chemical-mechanical-polish (CMP) to excess remove polysilicon from the surface of the dielectric layer and polish the polysilicon in the trench substantially flush with the surface of the dielectric layer.

In step 605, a dopant species is implanted. In one example, the dopant species is As implanted at a dose of about 1E15 to 1E16 atm/cm$^2$ at an energy of about 40 to 70 Kev.

In step 610, a polysilicon grain size modulation ion implant is performed. In one example, the polysilicon grain size modulation ion implant is an Sb ion implantation performed at a dose of about 1E15 to 1E16 atm/cm$^2$ and at an energy of about 30 to 70 Kev.

In step 615, an anneal is performed. The purpose of the anneal is to distribute the dopant species (for example As) and the Sb throughout the polysilicon line and especially more uniformly distribute the dopant than with otherwise occur without the dopant concentration profile modulation ion implant of step 610. In one example, the anneal is an RTA for 5 seconds at 800 to 1000° C. anneal.

In step 620, the damascene resistor is completed by forming contacts to the ends of the polysilicon line by processes well known in the art. The damascene resistor thus produced has improved resistance over conventional damascene resistors due to the improved dopant concentration profile caused by the dopant concentration profile modulation ion implant.

It has been shown that the present invention provides a method to control emitter resistance and base current in bipolar transistors and to overcome depletion of dopant in the gate electrode in FETs and the line of thin film and damascened resistors.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A method of modulating grain size in a polysilicon layer comprising:

forming said layer or polysilicon on a substrate; and performing an ion implantation of a polysilicon grain size modulating species into said polysilicon layer, wherein an average resultant grain size of the implanted polysilicon layer after performing a pre-determined anneal is higher than average resultant grain size than would be obtained after performing the same pre-determined anneal on the polysilicon layer without performing the polysilicon grain size modulating species ion implantation, and wherein said polysilicon grain size modulating species is antimony.

2. The method of claim 1, wherein said polysilicon grain size modulating species is implanted at a dose of 1E15 to 1.5E16 atm/cm$^2$ and at an energy of 30 to 70 Kev.

3. A method of fabricating a bipolar transistor having a collector, a base and a polysilicon emitter comprising:

implanting a dopant species and a polysilicon grain size modulating species into said polysilicon emitter, wherein said polysilicon grain size modulating species is antimony; and annealing the implanted polysilicon emitter, wherein an average resultant grain size of the implanted polysilicon emitter after performing said annealing is higher than an average resultant grain size than would be obtained after performing the same annealing on the polysilicon emitter without implanting the polysilicon grain size modulating species.

4. The method of claim 3, wherein said dopant species is arsenic.

5. The method of claim 3, wherein the base current of said bipolar transistor is higher or lower than the base current of an identical bipolar transistor fabricated without said polysilicon grain size modulating ion implantation step.

6. The method of claim 3, wherein the resistance of said emitter of said bipolar transistor is higher or lower than the emitter resistance of an identical bipolar transistor fabricated without said polysilicon grain size modulating species ion implantation step.

7. The method of claim 3, wherein said dopant species is arsenic and is implanted at a dose of 1E15 to 2.3E16 atm/cm$^2$ and at an energy of about 40 to 70 Kev, and wherein said polysilicon grain size modulating species is implanted at a dose of 1E15 to 1.5E16 atm/cm$^3$ and at an energy of 30 to 70 Kev.

8. The method of claim 3, wherein said annealing is performed using a rapid thermal anneal process at 900 to 1000° C. for about 5 to 20 seconds.

9. A method of modulating a dopant species concentration profile in a polysilicon layer of a device comprising:

implanting a dopant species and a polysilicon grain size modulating species into said polysilicon layer, wherein said polysilicon grain size modulating species is antimony; and annealing the implanted polysilicon layer, wherein an average resultant grain size of the implanted polysilicon layer after performing said annealing is higher than an average resultant grain size than would be obtained after performing the same annealing on the polysilicon layer without implanting the polysilicon grain size modulating species.

10. The method of claim 9, wherein said dopant species is arsenic.

11. The method of claim 9, wherein said dopant species is arsenic and is implanted at a dose of 1E15 to 2.3E16 atm/cm$^2$ and at an energy of about 40 to 70 Kev, and wherein said polysilicon grain size modulating species is implanted at a dose of 1E15 to 1.5E16 atm/cm$^2$ and at an energy of 30 to 70 Kev.

12. The method of claim 9, wherein the concentration of dopant is higher at a predetermined distance from a bottom surface of said polysilicon layer than the concentration of dopant at the same pre-determined distance from a bottom of an identical polysilicon layer of an identical device fabricated without said polysilicon grain size modulating ion implantation step.

13. The method of claim 9, wherein said annealing is performed using a rapid thermal anneal process at 900 to 1000° C. for about 5 to 20 seconds.

14. The method of claim 9, wherein said polysilicon layer forms at least a portion of a structure selected from the group consisting of polysilicon gates of field effect transistors, polysilicon emitters of bipolar transistors, polysilicon lines of thin film resistors and polysilicon lines of damascened thin film resistors.

15. A method of modulating grain size in a polysilicon layer comprising:

forming said layer of polysilicon on a substrate; and performing an ion implantation of a polysilicon grain size modulating species into said polysilicon layer, wherein an average resultant grain size of the implanted polysilicon layer after performing a pre-determined anneal is lower than an average resultant grain size than would be obtained after performing the same pre-determined anneal on the polysilicon layer without performing the polysilicon grain size modulating species ion implantation.

16. The method of claim 15, wherein said polysilicon grain size modulating species is carbon.

17. The method of claim 15, wherein said polysilicon grain size modulating species is implanted at a dose of 1E14 to 1E16 atm/cm$^2$ and at an energy of 15 to 35 Kev.

18. A method of fabricating a bipolar transistor having a collector, a base and a polysilicon emitter comprising:

implanting a dopant species and a polysilicon grain size modulating species into said polysilicon emitter; and annealing the implanted polysilicon emitter, wherein an average resultant grain size of the implanted polysilicon emitter after performing said annealing is lower than an average resultant grain size than would be obtained after performing the same annealing on the polysilicon emitter without implanting the polysilicon grain size modulating species.

19. The method of claim 18, wherein said dopant species is arsenic.

20. The method of claim 18, wherein said polysilicon grain size modulating species is carbon.

21. The method of claim 18, wherein the base current of said bipolar transistor is higher or lower than the base current of an identical bipolar transistor fabricated without said polysilicon grain size modulating ion implantation step.

22. The method of claim 18, wherein the resistance of said emitter of said bipolar transistor is higher or lower than the emitter resistance of an identical bipolar transistor fabricated without said polysilicon grain size modulating species ion implantation step.

23. The method of claim 18, wherein said dopant species is arsenic and is implanted at a dose of 1E15 to 2.3E16 atm/cm$^2$ and at an energy of about 40 to 70 Kev, and wherein said polysilicon grain size modulating species is implanted at a dose of 1E14 to 1E16 atm/cm$^2$ and at a energy of 15 to 35 Kev.

24. The method of claim 18, wherein said annealing is performed using a rapid thermal anneal process at 900 to 1000° C. for about 5 to 20 seconds.

25. A method of modulating a dopant species concentration profile in a polysilicon layer of a device comprising:

implanting at dopant species and a polysilicon grain size modulating species into said polysilicon layer; and annealing the implanted polysilicon layer, wherein an average resultant grain size of the implanted polysilicon layer after performing said annealing is lower than an average resultant grain size than would be obtained after performing the same annealing on the polysilicon layer without implanting the polysilicon grain size modulating species.

26. The method of claim 25, wherein said dopant species is arsenic.

27. The method of claim 25, wherein said polysilicon grain size modulating species is carbon.

28. The method of claim 25, wherein said polysilicon grain size modulating species is implanted at a dose of 1E14 to 1E16 atm/cm$^2$ and at an energy of 15 to 35 Kev.

29. The method of claim 25, wherein the concentration of dopant is higher at a predetermined distance from a bottom surface of said polysilicon layer than the concentration of dopant at the same pre-determined distance from a bottom of an identical polysilicon layer of an identical device fabricated without said polysilicon grain size modulating ion implantation step.

30. The method of claim 25, wherein said annealing is performed using a rapid thermal anneal process at 900 to 1000° C. for about 5 to 20 seconds.

31. The method of claim 25, wherein said polysilicon layer forms at least a portion of a structure selected from the group consisting of polysilicon gates of field effect transistors, polysilicon emitters of bipolar transistors, polysilicon lines of thin film resistors and polysilicon lines of damascened thin film resistors.

* * * * *

UNITED STATES PATENT AND TRADEMARK OFFICE
CERTIFICATE OF CORRECTION

PATENT NO. : 6,682,992 B2
DATED : January 27, 2004
INVENTOR(S) : Geiss et al.

It is certified that error appears in the above-identified patent and that said Letters Patent is hereby corrected as shown below:

Column 4,
Line 7, delete "GS," and insert -- $GS_1$ --.

Column 11,
Line 54, delete "$atm/cm^3$" and insert -- $atm/cm^2$ --.

Signed and Sealed this

Thirteenth Day of April, 2004

JON W. DUDAS
*Acting Director of the United States Patent and Trademark Office*